(12) United States Patent
Khlat

(10) Patent No.: US 12,191,814 B2
(45) Date of Patent: Jan. 7, 2025

(54) MULTI-MODE POWER AMPLIFIER APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 340 days.

(21) Appl. No.: 17/637,056

(22) PCT Filed: Aug. 19, 2020

(86) PCT No.: PCT/US2020/046895
§ 371 (c)(1),
(2) Date: Feb. 21, 2022

(87) PCT Pub. No.: WO2021/034878
PCT Pub. Date: Feb. 25, 2021

(65) Prior Publication Data
US 2022/0302879 A1    Sep. 22, 2022

Related U.S. Application Data

(60) Provisional application No. 62/890,093, filed on Aug. 22, 2019.

(51) Int. Cl.
*H04B 1/04*    (2006.01)
*H03F 1/02*    (2006.01)
(Continued)

(52) U.S. Cl.
CPC .......... *H03F 1/0233* (2013.01); *H03F 3/245* (2013.01); *H04B 1/04* (2013.01);
(Continued)

(58) Field of Classification Search
None
See application file for complete search history.

(56) References Cited

U.S. PATENT DOCUMENTS 8,054,126 B2 *  11/2011  Yang ..................... H03F 1/0288
                                                  330/124 R
11,588,507 B2 *   2/2023  Roberg .................... H03F 3/68
(Continued)

OTHER PUBLICATIONS

International Search Report and Written Opinion for International Patent Application No. PCT/US2020/046895, mailed Nov. 24, 2020, 19 pages.

*Primary Examiner* — Pablo N Tran
(74) *Attorney, Agent, or Firm* — Withrow & Terranova, P.L.L.C.

(57) ABSTRACT

An envelope tracking (ET) power amplifier apparatus is provided. The multi-mode power amplifier apparatus includes a pair of power amplifiers configured to amplify a radio frequency (RF) signal(s) and an output circuit that outputs the amplified RF signal(s) to a signal output(s). In examples disclosed herein, a control circuit can cause the multi-mode power amplifier apparatus to operate in different power management modes by changing a load impedance coupled to the signal output(s). In a non-limiting example, the control circuit can change a power management mode of the multi-mode power amplifier apparatus based on modulation bandwidth of the RF signal(s). As a result, the multi-mode power amplifier apparatus can operate across a wide range of modulation bandwidth without compromising efficiency and performance.

20 Claims, 6 Drawing Sheets

(51) Int. Cl.
*H03F 3/24* (2006.01)
*H04B 1/02* (2006.01)
*H04B 1/18* (2006.01)

(52) U.S. Cl.
CPC .. *H03F 2200/105* (2013.01); *H03F 2200/451* (2013.01); *H04B 2001/0433* (2013.01)

(56) References Cited

U.S. PATENT DOCUMENTS

| | | | |
|---|---|---|---|
| 2004/0183593 A1* | 9/2004 | Kwon | H03F 3/24 330/124 R |
| 2004/0189380 A1* | 9/2004 | Myer | H03F 1/0266 330/124 R |
| 2008/0074735 A1 | 3/2008 | Bakalski et al. | |
| 2009/0045877 A1* | 2/2009 | Wang | H03F 1/56 330/126 |
| 2014/0375389 A1 | 12/2014 | Jeon et al. | |
| 2015/0091653 A1* | 4/2015 | Kobayashi | H03F 1/0233 330/295 |
| 2018/0309409 A1 | 10/2018 | Khlat | |

* cited by examiner

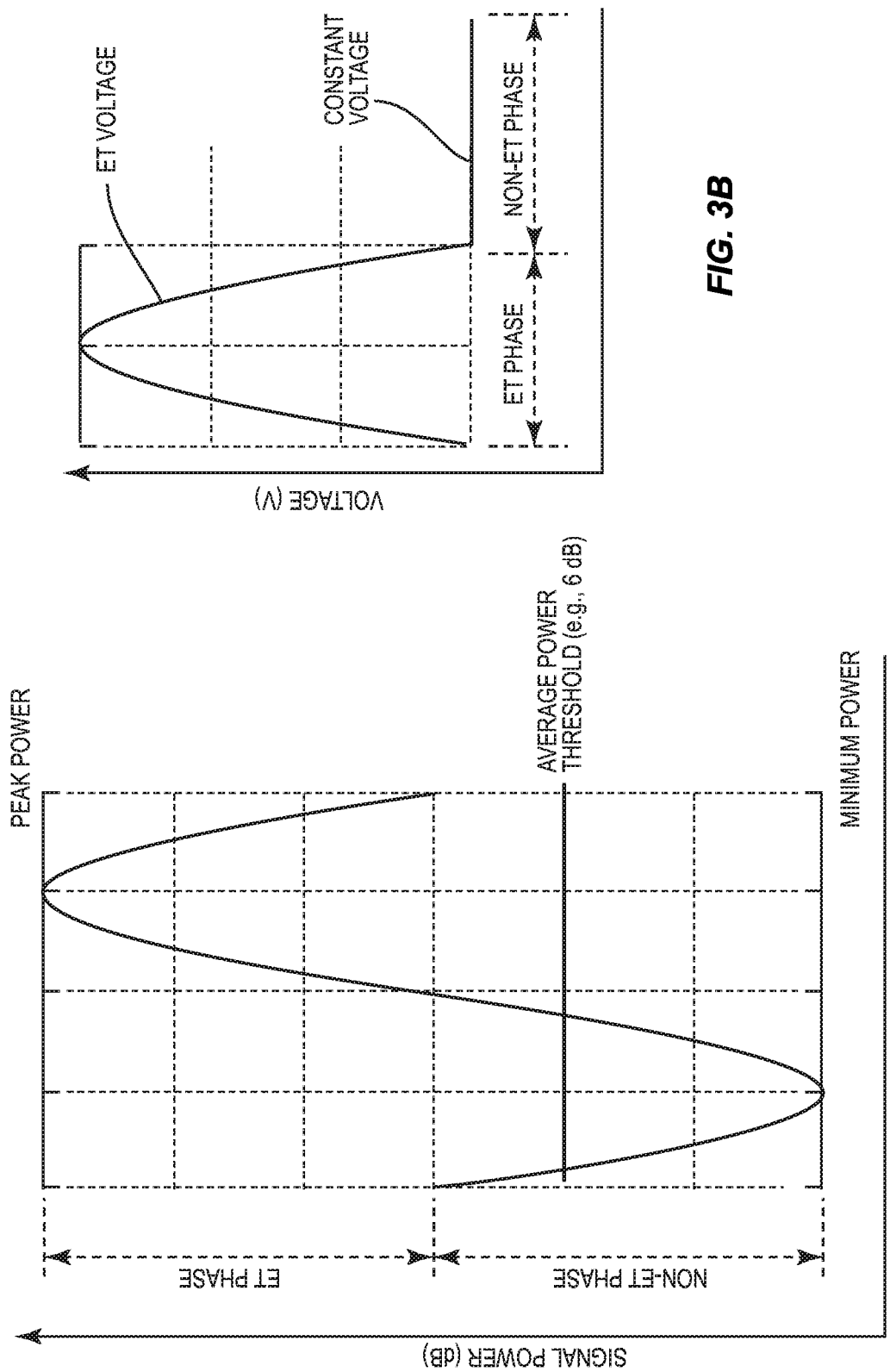

MULTI-MODE POWER AMPLIFIER APPARATUS

RELATED APPLICATIONS

This application is a 35 USC 371 national phase filing of International Application No. PCT/US2020/046895, filed Aug. 19, 2020, which claims the benefit of provisional patent application Ser. No. 62/890,093, filed Aug. 22, 2019, the disclosures of which are incorporated herein by reference in their entireties.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation new radio (5G-NR) wireless communication technology has been widely regarded as the next wireless communication standard beyond the current third-generation (3G) communication standard, such as wideband code division multiple access (WCDMA), and the fourth-generation (4G) communication standard, such as Long-Term Evolution (LTE). As such, a 5G-NR capable mobile communication device is expected to achieve significantly higher data rates, improved coverage range, enhanced signaling efficiency, and reduced latency compared with a conventional mobile communication device supporting only the 3G and 4G communication standards.

The 5G-NR capable mobile communication device can be configured to transmit a radio frequency (RF) signal(s) in a millimeter wave (mmWave) RF spectrum that is typically above 6 GHz. Notably, RF signals transmitted in the mmWave RF spectrum are more susceptible to propagation attenuation and interference. In this regard, the 5G-NR capable mobile communication device typically employs a power amplifier circuit(s) to help improve signal-to-noise ratio (SNR) and/or signal-to-interference-plus-noise ratio (SINR) of the RF signal(s). To mitigate the propagation attenuation, the 5G-NR capable mobile communication device may be configured to explore multipath diversity by simultaneously transmitting the RF signal(s) via multiple antennas. Furthermore, by simultaneously transmitting the RF signal(s) via multiple antennas, the 5G-NR capable mobile communication device may be able to increase data rates through spatial multiplexing.

Envelope tracking (ET) is a power management technique designed to improve operating efficiency of the power amplifier(s) to help reduce power consumption and thermal dissipation. More specifically, the power amplifier(s) is configured to amplify the RF signal(s) based on an ET voltage that rises and falls in accordance to an amplitude of the RF signal(s). Understandably, the better the ET voltage tracks the amplitude of the RF signal(s), the higher efficiency can be achieved in the power amplifier(s). In this regard, it may be desirable to provide the ET voltage in accordance to modulation bandwidth and power envelope of the RF signal(s).

SUMMARY

Embodiments of the disclosure relate to a multi-mode power amplifier apparatus. The multi-mode power amplifier apparatus includes a pair of power amplifiers configured to amplify a radio frequency (RF) signal(s) and an output circuit that outputs the amplified RF signal(s) to a signal output(s). In examples disclosed herein, a control circuit can cause the multi-mode power amplifier apparatus to operate in different power management modes by changing a load impedance coupled to the signal output(s). In a non-limiting example, the control circuit can change a power management mode of the multi-mode power amplifier apparatus based on modulation bandwidth of the RF signal(s). As a result, the multi-mode power amplifier apparatus can operate across a wide range of modulation bandwidth without compromising efficiency and performance.

In one aspect, a multi-mode power amplifier apparatus is provided. The multi-mode power amplifier apparatus includes a first power amplifier configured to amplify a first composite signal comprising at least one RF signal.

The multi-mode power amplifier apparatus also includes a second power amplifier configured to amplify a second composite signal comprising the at least one RF signal. The multi-mode power amplifier apparatus also includes an output circuit configured to regenerate the at least one RF signal from the first composite signal and the second composite signal. The multi-mode power amplifier apparatus also includes a first signal output and a second signal output configured to output the at least one RF signal. The multi-mode power amplifier apparatus also includes a control circuit. The control circuit is configured to change a load impedance at one or more of the first signal output and the second signal output to change a power management mode of the multi-mode power amplifier apparatus.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 3A and 3B are graphical diagrams providing exemplary illustrations of a hybrid mode of operation of the multi-mode power amplifier apparatus of FIG. 1.

DETAILED DESCRIPTION

Figure 1:
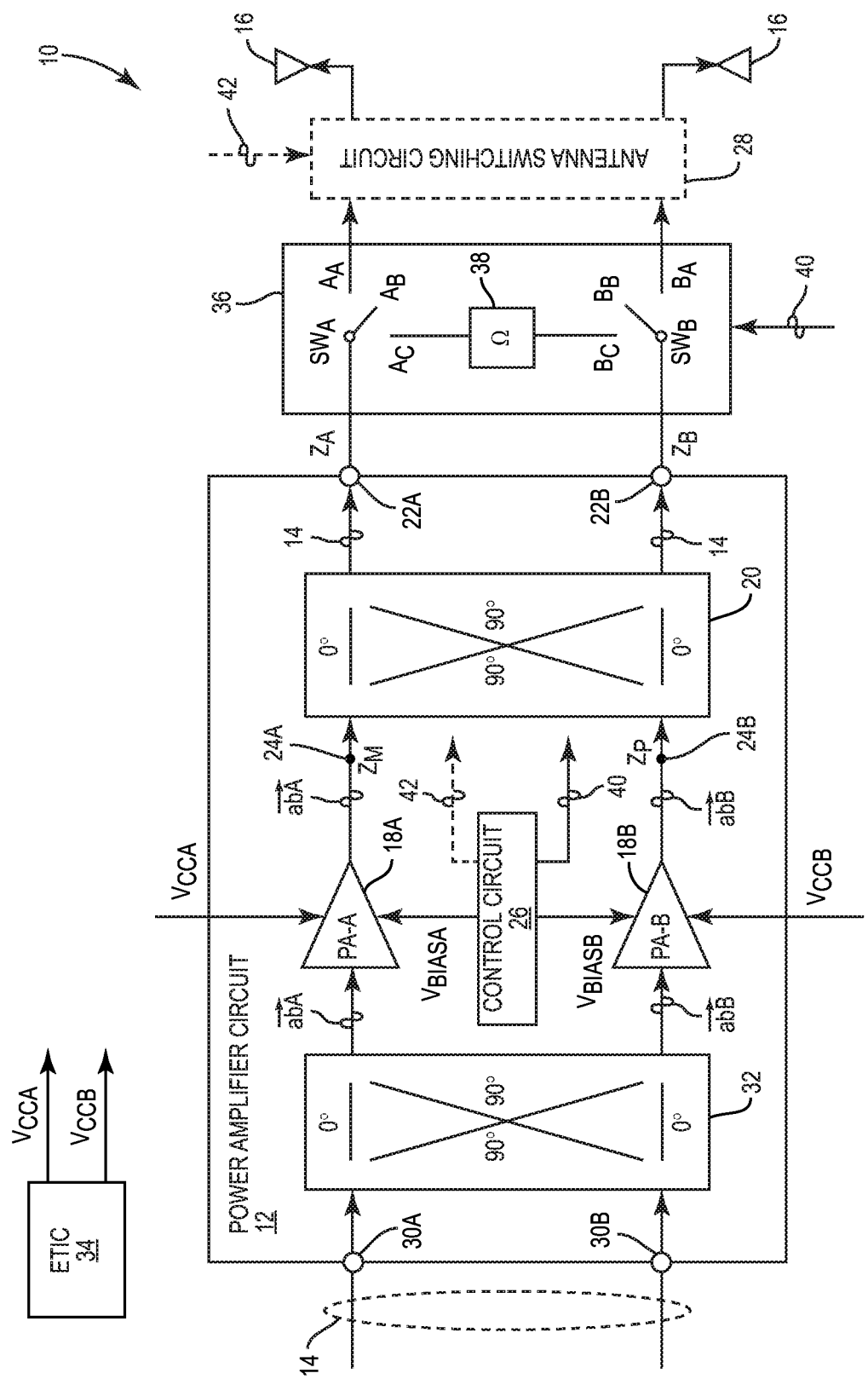
FIG. 1 is a schematic diagram of an exemplary multi-mode power amplifier apparatus configured according to an embodiment of the present disclosure to operate in different power management modes.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-mode power amplifier apparatus. The multi-mode power amplifier apparatus includes a pair of power amplifiers configured to amplify a radio frequency (RF) signal(s) and an output circuit that outputs the amplified RF signal(s) to a signal output(s). In examples disclosed herein, a control circuit can cause the multi-mode power amplifier apparatus to operate in different power management modes by changing a load impedance coupled to the signal output(s). In a non-limiting example, the control circuit can change a power management mode of the multi-mode power amplifier apparatus based on modulation bandwidth of the RF signal(s). As a result, the multi-mode power amplifier apparatus can operate across a wide range of modulation bandwidth without compromising efficiency and performance.

FIG. 1 is a schematic diagram of an exemplary multi-mode power amplifier apparatus 10 configured according to an embodiment of the present disclosure to operate in different power management modes. The multi-mode power amplifier apparatus 10 includes a power amplifier circuit 12 configured to amplify at least one RF signal 14 for transmission over one or more antennas 16. The power amplifier circuit 12 includes a first power amplifier 18A (denoted as "PA-A") and a second power amplifier 18B (denoted as "PA-B"). The first power amplifier 18A is configured to amplify a first composite signal $\vec{abA}$ based on a first ET voltage $V_{CCA}$ and a first bias voltage $V_{BiasA}$. The second power amplifier 18B is configured to amplify a second composite signal $\vec{abB}$ based on a second ET voltage $V_{CCB}$ and a second bias voltage $V_{BiasB}$. Each of the first composite signal $\vec{abA}$ and the second composite $\vec{abB}$ is a reconstructed signal from the RF signal 14. As such, each of the first composite signal $\vec{abA}$ and the second composite $\vec{abB}$ includes the RF signal 14.

The power amplifier circuit 12 includes an output circuit 20 configured to couple the first power amplifier 18A and the second power amplifier 18B with a first signal output 22A and a second signal output 22B. In a non-limiting example, the first power amplifier 18A is coupled to a first coupling node 24A, the second power amplifier 18B is coupled to a second coupling node 24B, and the output circuit 20 is coupled to both the first coupling node 24A and the second coupling node 24B. As such, the first power amplifier 18A sees impedance $Z_M$ at the first coupling node 24A and the second power amplifier 18B sees impedance $Z_P$ at the second coupling node 24B.

The output circuit 20 receives the amplified first composite signal $\vec{abA}$ and the amplified second composite signal $\vec{abB}$ from the first power amplifier 18A and the second power amplifier 18B, respectively. Accordingly, the output circuit 20 regenerates the RF signal 14 from the amplified first composite signal $\vec{abA}$ and the amplified second composite signal $\vec{abB}$. The power amplifier circuit 12 can be configured to output the RF signal 14 via any one or more of the first signal output 22A and the second signal output 22B. The power amplifier circuit 12 includes a control circuit 26, which can be any type or combination of microcontroller, microprocessor, and field-programmable gate array (FPGA), as an example.

The first signal output 22A and the second signal output 22B may be coupled to the antennas 16 via an antenna switching circuit 28. The antenna switching circuit 28 can include any type and combination of switches to selectively couple the first signal output 22A and the second signal output 22B to any one or more of the antennas 16. As such, the first signal output 22A and the second signal output 22B can each see a respective load impedance presented by the antenna switching circuit 28, the antennas 16, and other circuits (e.g., filters). In a non-limiting example, the first signal output 22A sees a first load impedance $Z_A$ and the second signal output 22B sees a second load impedance $Z_B$.

In various embodiments discussed hereinafter, the control circuit 26 can dynamically change one or more of the first load impedance $Z_A$ and the second load impedance $Z_B$ to change a power management mode of the power amplifier circuit 12 and, thus, the multi-mode power amplifier apparatus 10. In a non-limiting example, the control circuit 26 can change the power management mode of the multi-mode power amplifier apparatus 10 based on modulation bandwidth of the RF signal 14. For example, the control circuit 26 can cause the multi-mode power amplifier apparatus 10 to operate in a first power management mode (also referred to as "envelope tracking (ET) mode") when the modulation bandwidth is below a bandwidth threshold (e.g., 300 MHz). In contrast, the control circuit 26 can cause the multi-mode power amplifier apparatus 10 to operate in a second power management mode (also referred to as "hybrid mode") when the modulation bandwidth is above the bandwidth threshold. As a result, the multi-mode power amplifier apparatus 10 can operate across a wide range of modulation bandwidth without compromising efficiency and performance.

The power amplifier circuit 12 may include a first signal input 30A and a second signal input 30B, which can be coupled to a transceiver circuit (not shown) to receive the RF signal 14. The power amplifier circuit 12 may also include an input circuit 32. The input circuit 32 can be configured to generate the first composite signal $\overrightarrow{abA}$ and the second composite $\overrightarrow{abB}$ to each include the RF signal 14.

The multi-mode power amplifier apparatus 10 may further include an ET integrated circuit (ETIC) 34 configured to generate the first ET voltage $V_{CCA}$ and the second ET voltage $V_{CCB}$ that track (rise and fall) a time-variant power envelope of the RF signal 14. In a non-limiting example, the ETIC 34 is configured to provide the first ET voltage $V_{CCA}$ and the second ET voltage $V_{CCB}$ to the first power amplifier 18A and the second power amplifier 18B, respectively.

The multi-mode power amplifier apparatus 10 can be configured to include an impedance circuit 36. The impedance circuit 36 can be coupled between the first signal output 22A, the second signal output 22B, and the antenna switching circuit 28. As discussed in various embodiments below, the control circuit 26 can control the impedance circuit 36 to change any one or more of the first load impedance $Z_A$ and the second load impedance $Z_B$ to change the power management mode of the multi-mode power amplifier apparatus 10.

Figure 2A:
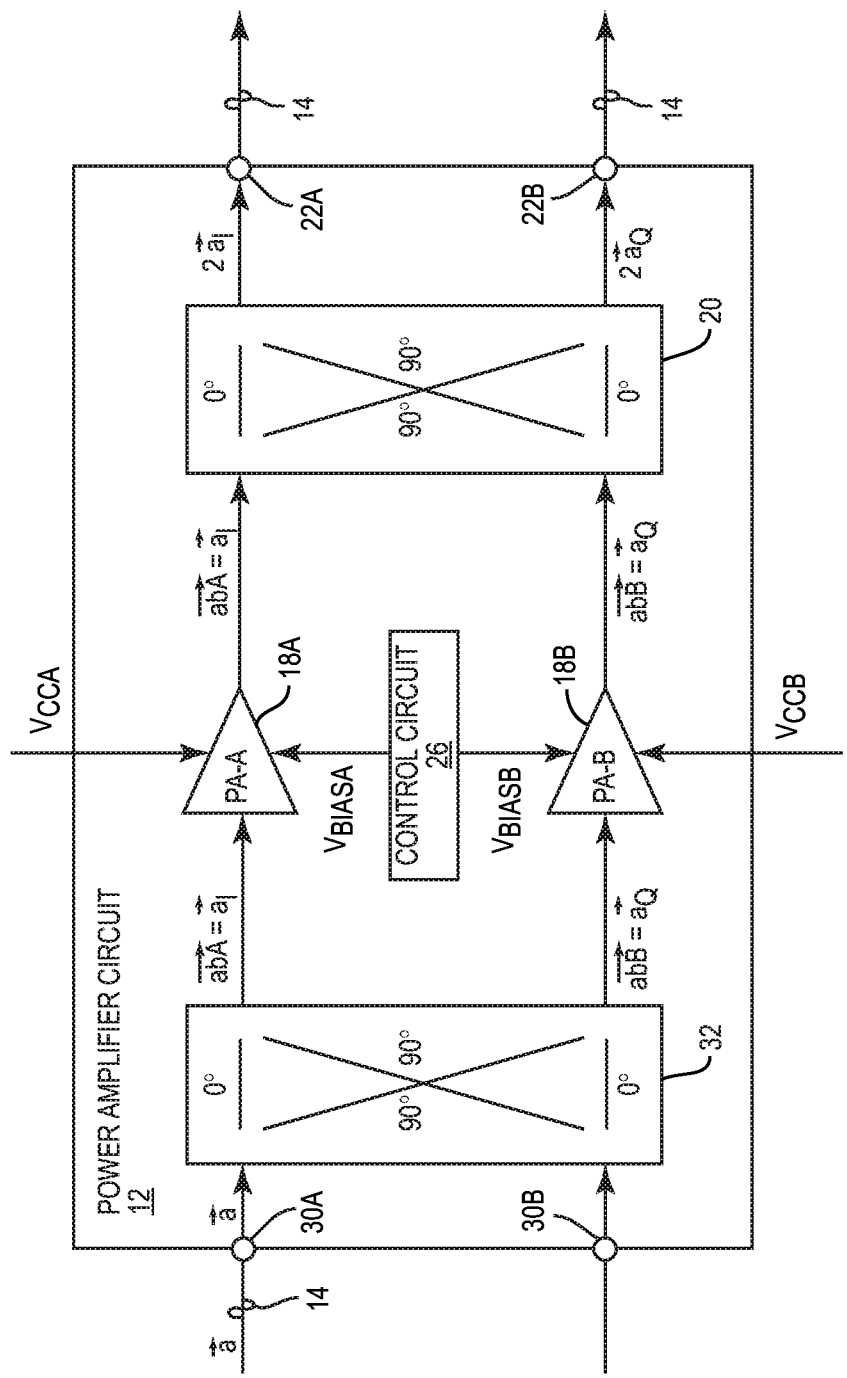
FIGS. 2A and 2B are schematic diagrams providing exemplary illustrations of the multi-mode power amplifier apparatus of FIG. 1 configured to amplify only one radio frequency (RF) signal.
Figure 2B:
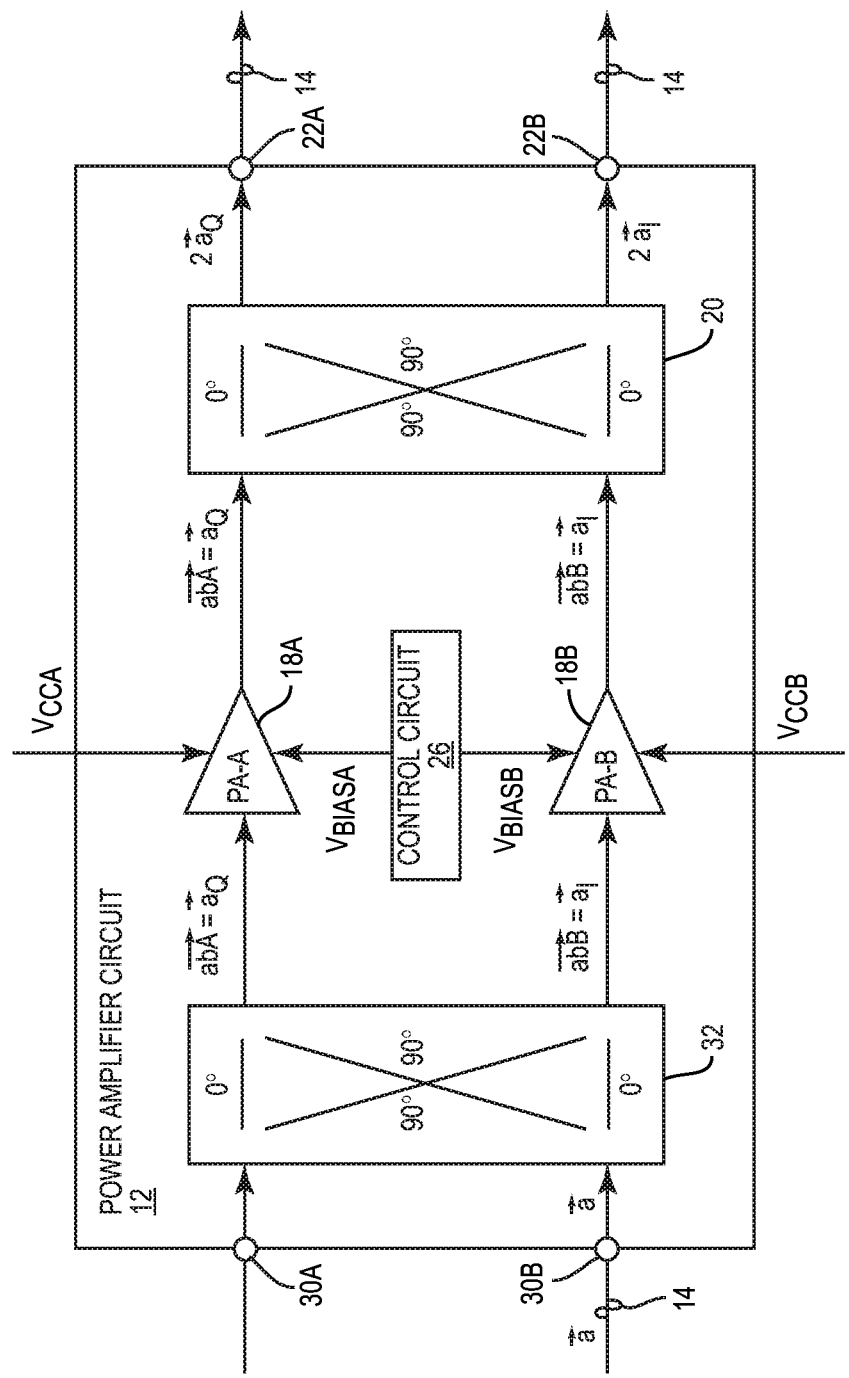

In one non-limiting example, the RF signal 14 includes only one RF signal $\vec{a}$, which can be received by the power amplifier circuit 12 via either the first signal input 30A or the second signal input 30B. In this regard, FIGS. 2A and 2B are schematic diagrams providing exemplary illustrations of the multi-mode power amplifier apparatus 10 of FIG. 1 configured to amplify the RF signal 14 that includes only one RF signal $\vec{a}$. Common elements between FIGS. 1, 2A, and 2B are shown therein with common element numbers and will not be re-described herein.

With reference to FIG. 2A, the power amplifier circuit 12 receives the RF signal $\vec{a}$ via the first signal input 30A. The input circuit 32 generates the first composite signal $\overrightarrow{abA}$ including an in-phase component $\vec{a}_I$ of the RF signal $\vec{a}$ ($\overrightarrow{abA}=\vec{a}_I$) and the second composite signal $\overrightarrow{abB}$ including a quadrature component $\vec{a}_Q$ of the RF signal $\vec{a}$ ($\overrightarrow{abB}=\vec{a}_Q$). In this regard, each of the first composite signal $\overrightarrow{abA}$ and the second composite signal $\overrightarrow{abB}$ has one-half (½) power of the average power, for example root-to-mean-square (RMS) power, of the RF signal $\vec{a}$. In this regard, the first composite signal $\overrightarrow{abA}$ and the second composite signal $\overrightarrow{abB}$ can be said to have equal average power.

The first power amplifier 18A and the second power amplifier 18B are configured to amplify the first composite signal $\overrightarrow{abA}$ and the second composite signal $\overrightarrow{abB}$. The output circuit 20 can perform a ninety-degree (90°) phase shift on the second composite signal $\overrightarrow{abB}$ to regenerate the RF signal $\vec{a}$ ($\vec{a}=2\vec{a}_I$) at the first signal output 22A. The output circuit 20 can perform a 90° phase shift on the first composite signal $\overrightarrow{abA}$ to regenerate the RF signal $\vec{a}$ ($\vec{a}=2\vec{a}_Q$) at the second signal output 22B. The control circuit 26 causes the power amplifier circuit 12 to output the RF signal $\vec{a}$ via a selected one of the first signal output 22A and the second signal output 22B based on, for example, an indication from the transceiver circuit.

With reference to FIG. 2B, the power amplifier circuit 12 can also receive the RF signal $\vec{a}$ via the second signal input 30B. The input circuit 32 generates the first composite signal $\overrightarrow{abA}$ including a quadrature component $\vec{a}_Q$ of the RF signal $\vec{a}$ ($\overrightarrow{abA}=\vec{a}_Q$) and the second composite signal $\overrightarrow{abB}$ including an in-phase component di of the RF signal $\vec{a}$ ($\overrightarrow{abB}=\vec{a}_I$). In this regard, each of the first composite signal $\overrightarrow{abA}$ and the second composite signal $\overrightarrow{abB}$ has ½ power of the average power, for example RMS power, of the RF signal $\vec{a}$. In this regard, the first composite signal $\overrightarrow{abA}$ and the second composite signal $\overrightarrow{abB}$ can be said to have equal average power.

The first power amplifier 18A and the second power amplifier 18B are configured to amplify the first composite signal $\overrightarrow{abA}$ and the second composite signal $\overrightarrow{abB}$. The output circuit 20 can perform a 90° phase shift on the second composite signal $\overrightarrow{abB}$ to regenerate the RF signal $\vec{a}$ ($\vec{a}=2\vec{a}_Q$) at the first signal output 22A. The output circuit 20 can perform a 90° phase shift on the first composite signal $\overrightarrow{abA}$ to regenerate the RF signal $\vec{a}$ ($\vec{a}=2\vec{a}_I$) at the second signal output 22B. The control circuit 26 causes the power amplifier circuit 12 to output the RF signal $\vec{a}$ via a selected one of the first signal output 22A and the second signal output 22B based on, for example, an indication from the transceiver circuit.

Figure 2C:
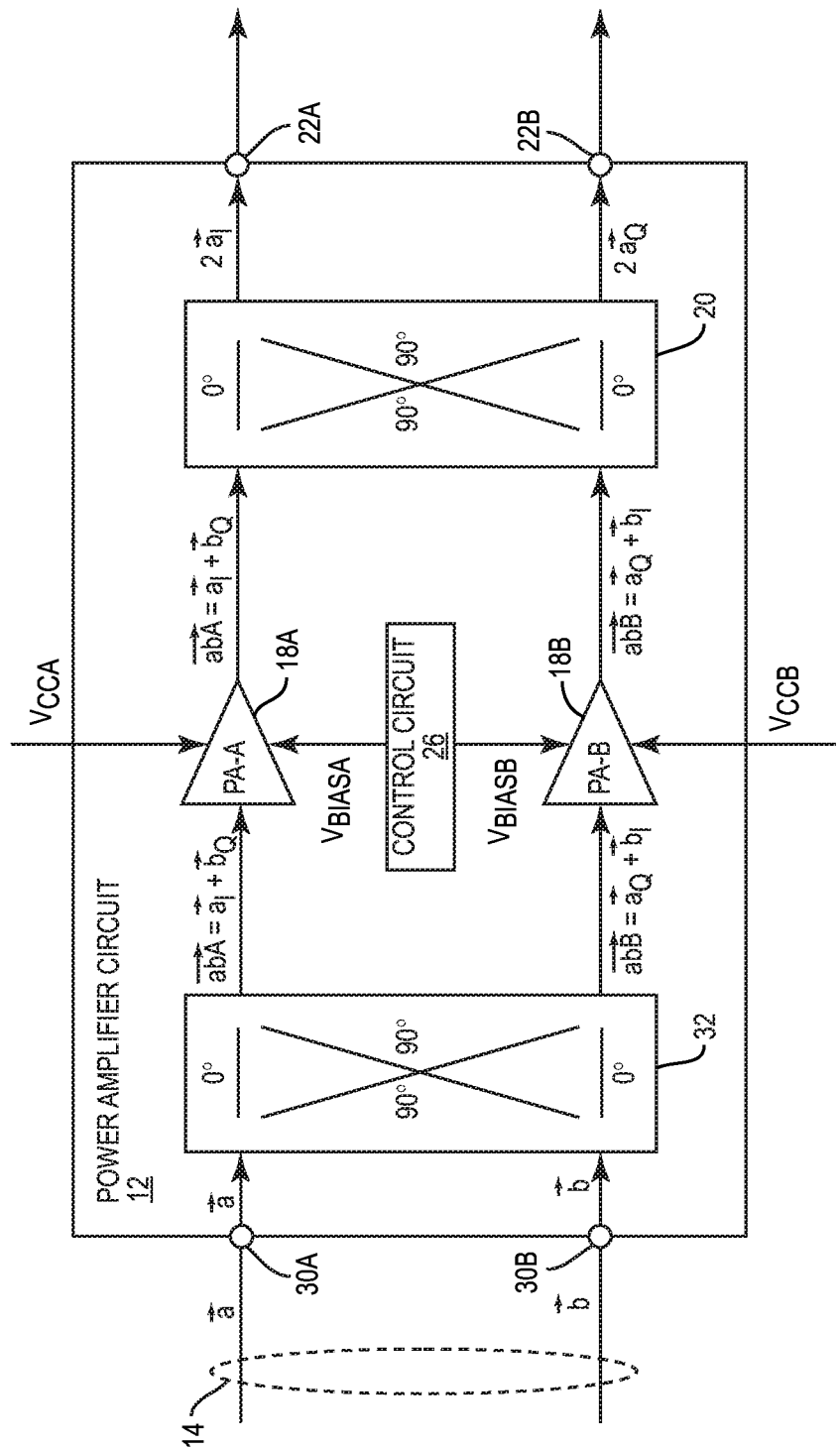
FIG. 2C is a schematic diagram providing exemplary illustrations of the multi-mode power amplifier apparatus of FIG. 1 configured to amplify a pair of RF signals concurrently.

In another non-limiting example, the RF signal 14 includes a first RF signal $\vec{a}$ and a second RF signal $\vec{b}$. In this regard, FIG. 2C is a schematic diagram providing an exemplary illustration of the multi-mode power amplifier apparatus 10 of FIG. 1 configured to amplify the first RF signal $\vec{a}$ and the second RF signal $\vec{b}$ concurrently. Common elements between FIGS. 1 and 2C are shown therein with common element numbers and will not be re-described herein.

With reference to FIG. 2C, the power amplifier circuit 12 receives the first RF signal $\vec{a}$ and the second RF signal $\vec{b}$ via the first signal input 30A and the second signal input 30B, respectively. The input circuit 32 generates the first composite signal $\overrightarrow{abA}$ including an in-phase component $\vec{a}_I$ of the first RF signal a and a quadrature component $\vec{b}_Q$ of the second RF signal $\vec{b}$ ($\overrightarrow{abA}=\vec{a}_I+\vec{b}_Q$). The input circuit 32 also generates the second composite signal $\overrightarrow{abB}$ including a quadrature component $\vec{a}_Q$ of the first RF signal $\vec{a}$ and an in-phase component $\vec{b}_I$ of the second RF signal $\vec{b}$ ($\overrightarrow{abB}=\vec{a}_Q+\vec{b}_I$).

The first power amplifier 18A and the second power amplifier 18B are configured to amplify the first composite signal $\overrightarrow{abA}$ and the second composite signal $\overrightarrow{abB}$. The output circuit 20 performs a 90° phase shift on the quadrature component $\vec{a}_Q$ of the first RF signal $\vec{a}$ to regenerate the first RF signal $\vec{a}$ ($\vec{a}=2\vec{a}_I$) at the first signal output 22A. The output circuit 20 also performs a 90° phase shift on the quadrature component $\vec{b}_Q$ of the second RF signal $\vec{b}$ to regenerate the second RF signal $\vec{b}$ ($\vec{b}=2\vec{b}_I$) at the second signal output 22B. The control circuit 26 can cause the power amplifier circuit 12 to concurrently output the first RF signal $\vec{a}$ and the second RF signal $\vec{b}$ via the first signal output 22A and the second signal output 22B, respectively. Accordingly, the first RF signal $\vec{a}$ and the second RF signal $\vec{b}$ can be concurrently transmitted via the antennas 16 in accordance to a multiple-input multiple-output (MIMO) or a carrier aggregation (CA) configuration.

With reference back to FIG. 1, in a non-limiting example, the impedance circuit 36 can include a first switch $SW_A$, a second switch $SW_B$, and a fixed impedance circuit 38 (denoted as "Ω"). The control circuit 26 can control the impedance circuit via an impedance control signal 40. Specifically, the control circuit 26 can use the impedance control signal 40 to toggle the first switch $SW_A$ between positions $A_A$, $A_B$, and $A_C$ and to toggle the second switch $SW_B$ between positions $B_A$, $B_B$, and $B_C$. As discussed in examples below, the control circuit 26 can control the impedance circuit 36 to present different impedance to the first signal output 22A and/or the second signal output 22B.

In one non-limiting example, the power amplifier circuit 12 is configured to output the RF signal 14 via the first signal output 22A (the "selected one of the first signal output 22A and the second signal output 22B") and not to output the RF signal 14 via the second signal output 22B ("another one of the first signal output 22A and the second signal output 22B").

When the control circuit 26 determines that the RF signal 14 is modulated at a lower modulation bandwidth (e.g., <300 MHz), the control circuit 26 can configure the power amplifier circuit 12 to operate in the first power management mode ("ET mode"). The control circuit 26 may use the first bias voltage $V_{BiasA}$ and the second bias voltage $V_{BiasB}$ to configure the first power amplifier 18A and the second power amplifier 18B to operate in the ET mode to help improve efficiency and linearity of the first power amplifier 18A and the second power amplifier 18B.

In this regard, the control circuit 26 can control the impedance circuit 36 to couple the first signal output 22A to the antenna switching circuit 28 and to couple the second signal output 22B to a fixed impedance (e.g., 50Ω). Specifically, the control circuit 26 can toggle the first switch $SW_A$ to position $A_A$ and the second switch $SW_B$ to position $B_C$. As such, the RF signal 14 can be provided from the first signal output 22A to the antenna switching circuit 28 via the first switch $SW_A$. The control circuit 26 may generate an antenna control signal 42 to control the antenna switching circuit 28 such that the RF signal can be radiated from any one or more of the antennas 16.

In contrast, when the control circuit 26 determines that the RF signal 14 is modulated at a higher modulation bandwidth (e.g., 300 MHz), the control circuit 26 can configure the power amplifier circuit 12 to operate in the second power management mode ("hybrid mode"). The control circuit 26 may control the impedance circuit 36 to couple the first signal output 22A to the antenna switching circuit 28 and to couple the second signal output 22B to an open impedance ($\cong\infty$). Specifically, the control circuit 26 can toggle the first switch $SW_A$ to position $A_A$ and the second switch $SW_B$ to position $B_B$. As such, the RF signal 14 can be provided from the first signal output 22A to the antenna switching circuit 28 via the first switch $SW_A$. The control circuit 26 may generate an antenna control signal 42 to control the antenna switching circuit 28 such that the RF signal 14 can be radiated from any one or more of the antennas 16.

Notably, when the RF signal 14 is modulated in the higher modulation bandwidth, the time-variant power envelope of the RF signal 14 can have a higher peak-to-average ratio (PAR). Accordingly, the first power amplifier 18A and/or the second power amplifier 18B may need to amplify the RF signal 14 to a higher average power from time to time. Given the well-known relationship between power (P), voltage ($V_{CC}$), and current (I), $P=V_{CC}*I$, if the current I is held constant, the first power amplifier 18A and/or the second power amplifier 18B would require a higher voltage $V_{CC}$ to satisfy the higher average power P. However, the ETIC 34 may only be capable of generating either the first ET voltage $V_{CCA}$ or the second ET voltage $V_{CCB}$ up to a limit (e.g., 5 V). As a result, the first power amplifier 18A and/or the second power amplifier 18B may not be able to deliver the higher average power P.

It may be possible to configure the ETIC 34 to ramp up the first ET voltage $V_{CCA}$ and/or the second ET voltage $V_{CCB}$ to a higher level to deliver the higher average power P, and doing so would understandably cause energy waste and lower efficiency in the first power amplifier 18A and/or the second power amplifier 18B when the average power P of the RF signal 14 is lower. As such, it may be desirable to configure the power amplifier circuit 12 to operate in accordance to the time-variant power envelope of the RF signal 14.

In this regard, in the hybrid mode, the control circuit 26 may be configured to selectively deactivate one of the first power amplifier 18A and the second power amplifier 18B when the average power of the RF signal 14 is below an average power threshold (e.g., 6 dB).

In a non-limiting example that is referenced hereinafter, the first power amplifier 18A remains activated while the second power amplifier 18B is deactivated in the hybrid mode. In one embodiment, the first power amplifier 18A and the second power amplifier 18B can each have an internal controller configured to activate the first power amplifier 18A and deactivate the second power amplifier 18B when the average power of the RF signal 14 is below the average power threshold. In another embodiment, the control circuit 26 can keep the first power amplifier 18A activated and deactivate the second power amplifier 18B by adjusting the first bias voltage $V_{BiasA}$ and the second bias voltage $V_{BiasB}$.

The control circuit 26 configures the power amplifier circuit 12 to output the RF signal 14 via the first signal output 22A. Accordingly, the control circuit 26 controls the impedance circuit 36 to couple the first signal output to the antenna switching circuit 28 and to couple the open impedance to the second signal output 22B. The first power amplifier 18A will operate in a non-ET phase based on a constant voltage generated as a result of coupling the open impedance to the second signal output 22B, until the average power of the RF signal rises above the average power threshold.

When the average power of the RF signal 14 rises above the average power threshold, the control circuit 26 may activate both the first power amplifier 18A and the second power amplifier 18B to operate in an ET phase, for example, by adjusting the first bias voltage $V_{BiasA}$ and the second bias voltage $V_{BiasB}$. Accordingly, the ETIC 34 can provide the first ET voltage $V_{CCA}$ and the second ET voltage $V_{CCB}$ to the first power amplifier 18A and the second power amplifier 18B, respectively.

FIGS. 3A and 3B are graphical diagrams providing exemplary illustrations of the hybrid mode of operation of the multi-mode power amplifier apparatus 10 of FIG. 1. Elements of FIG. 1 are referenced in conjunction with FIGS. 3A and 3B and will not be re-described herein.

With reference to FIG. 3A, during the non-ET phase, the ETIC 34 may be inactive and thus will not generate the first ET voltage $V_{CCA}$ and the second ET voltage $V_{CCB}$. The first power amplifier 18A is activated and the second power amplifier 18B is deactivated. The control circuit 26 couples the first signal output 22A to the antenna switching circuit 28 to output the RF signal 14, while coupling the open impedance to the second signal output 22B. As shown in FIG. 3B, the first power amplifier 18A operates based on the constant voltage generated as a result of coupling the open impedance to the second signal output 22B.

When the average power of the RF signal 14 rises above the average power threshold (e.g., 6 dB), the power amplifier circuit 12 starts transitioning from the non-ET phase to the ET phase. In this regard, both the first power amplifier 18A and the second power amplifier 18B are activated. The ETIC 34 is also activated to provide the first ET voltage $V_{CCA}$ and the second ET voltage $V_{CCB}$ to the first power amplifier 18A and the second power amplifier 18B, respectively. In the meantime, the first signal output 22A remains coupled to the antenna switching circuit 28 and the second signal output 22B remains coupled to the open impedance.

Figure 4:
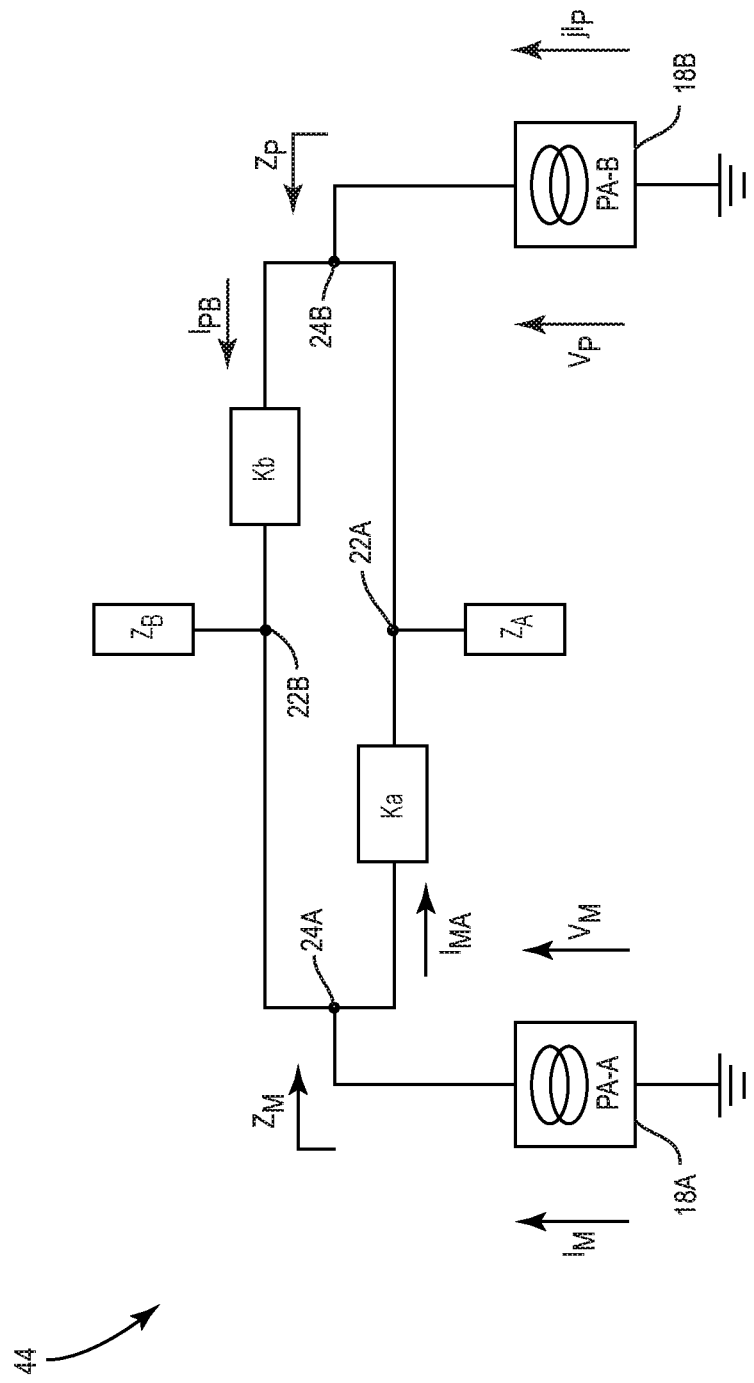
FIG. 4 is an equivalent electrical model that helps to explain certain operational principles of the multi-mode power amplifier apparatus of FIG. 1 in the different power management modes.

To help understand how the power amplifier circuit 12 can generate the constant voltage during the non-ET phase as a result of coupling the second signal output to the open impedance, an equivalent electrical model of the power amplifier circuit 12 is now discussed with reference to FIG. 4. FIG. 4 is an equivalent electrical model 44 that helps to explain certain operational principles of the multi-mode power amplifier apparatus 10 of FIG. 1 in the different power management modes. Common elements between FIGS. 1 and 4 are shown therein with common element numbers and will not be re-described herein.

In the equivalent electrical model 44, $V_M$ represents a voltage applied to the first power amplifier 18A, $I_M$ represents a current flowing through the first power amplifier 18A, $I_{MA}$ represents a current flowing from the first coupling node 24A toward the first signal output 22A, $V_P$ represents a voltage applied to the second power amplifier 18B, $jI_P$ represents a current flowing through the second power amplifier 18B, and $I_{PB}$ represents a current flowing from the second coupling node 24B toward the second signal output 22B. Ka and Kb are coupling factors.

Based on the equivalent electrical model 44, the following equations can be established.

$$Z_M = [(-K_{eq}^2/Z_A)/(1-K_{eq}^2/(Z_A \cdot Z_B))] \cdot [1-(jI_P/I_M) \cdot (Z_A/K_{eq})]$$

$$V_M = Z_M \cdot I_M = [(-K_{eq}^2/A_A)/(1-K_{eq}^2/(Z_A \cdot Z_B))] \cdot [1-(jI_P/I_M) \cdot (Z_A/K_{eq})] \cdot I_M$$

$$Z_P = [(-K_{eq}^2/Z_B)/(1-K_{eq}^2/(Z_A \cdot Z_B))] \cdot [1-(I_M/jI_P) \cdot (Z_B/K_{eq})]$$

$$V_P = Z_P \cdot jI_P = [(-K_{eq}^2/Z_B)/(1-K_{eq}^2/(Z_A \cdot Z_B))] \cdot [1-(I_M/jI_P) \cdot (Z_B/K_{eq})] \cdot jI_P$$

$$K_{eq} = (Ka \cdot Kb)/(Ka+Kb)$$

In the event the second signal output 22B is coupled to the open impedance, $Z_B$ becomes infinite ($Z_B = \infty$). As a result, $Z_M = (-K_{eq}^2/Z_A) \cdot [1-(jI_P/I_M) \cdot (Z_A/K_{eq})]$ and $V_M = Z_M \cdot I_M$. In this regard, in order to have zero power on $Z_M$, it will be necessary for $Z_A$ to be infinite or for the term $[1-(jI_P/I_M) \cdot (Z_A/K_{eq})]$ to be zero. Similarly, in order to have zero power on $Z_P$, it will be necessary for $Z_B$ to be infinite or for the term $[1-(I_M/jI_P) \cdot (Z_B/K_{eq})]$ to be zero. Thus, the operational principle of the power amplifier circuit 12 in the hybrid mode can be generalized as follows:

If $Z_M = Z_P = Z$, in order to have zero power on $Z_M$, it will require $Z_A$ to be infinite or $I_P = -I_M$. Likewise, in order to have zero power on $Z_P$, it will require $Z_B$ to be infinite or $I_P = I_M$.

Those skilled in the art will recognize improvements and modifications to the preferred embodiments of the present disclosure. All such improvements and modifications are considered within the scope of the concepts disclosed herein and the claims that follow.

What is claimed is:

1. A multi-mode power amplifier apparatus comprising:
   a first power amplifier configured to amplify a first composite signal comprising at least one radio frequency (RF) signal;
   a second power amplifier configured to amplify a second composite signal comprising the at least one RF signal;
   an output circuit configured to regenerate the at least one RF signal from the first composite signal and the second composite signal;
   a first signal output and a second signal output configured to output the at least one RF signal; and
   a control circuit configured to change a load impedance at one or more of the first signal output and the second signal output based on a modulation bandwidth of the RF signal to thereby cause the multi-mode power amplifier apparatus to operate in one of an envelope tracking (ET) mode and a hybrid mode.

2. The multi-mode power amplifier apparatus of claim 1 further comprising an impedance circuit coupled to the first signal output and the second signal output, wherein the control circuit is further configured to control the impedance circuit to change the load impedance.

3. The multi-mode power amplifier apparatus of claim 1 further comprising:
   a first signal input and a second signal input configured to receive the at least one RF signal; and
   an input circuit configured to generate the first composite signal and the second composite signal each comprising the at least one RF signal.

4. The multi-mode power amplifier apparatus of claim 1 further comprising an antenna switching circuit configured to selectively couple the first signal output and the second signal output to one or more antennas.

5. The multi-mode power amplifier apparatus of claim 1 further comprising an ET integrated circuit (ETIC) configured to provide a first ET voltage and a second ET voltage to the first power amplifier and the second power amplifier, respectively.

6. The multi-mode power amplifier apparatus of claim 1 further comprising:
   a first signal input and a second signal input configured to receive the at least one RF signal;
   an input circuit configured to generate the first composite signal and the second composite signal each comprising the at least one RF signal;
   an impedance circuit coupled to the first signal output and the second signal output;
   an antenna switching circuit coupled between the impedance circuit and one or more antennas; and
   an ET integrated circuit (ETIC) configured to provide a first ET voltage and a second ET voltage to the first power amplifier and the second power amplifier, respectively.

7. The multi-mode power amplifier apparatus of claim 1 wherein:
   the first power amplifier is further configured to amplify the first composite signal comprising an in-phase component of the at least one RF signal; and
   the second power amplifier is further configured to amplify the second composite signal comprising a quadrature component of the at least one RF signal and having equal average power as the first composite signal.

8. The multi-mode power amplifier apparatus of claim 7 wherein a selected one of the first signal output and the second signal output is configured to output the at least one RF signal comprising two times the in-phase component.

9. The multi-mode power amplifier apparatus of claim 7 wherein a selected one of the first signal output and the second signal output is configured to output the at least one RF signal comprising two times the quadrature component.

10. The multi-mode power amplifier apparatus of claim 1 wherein:
    the first power amplifier is further configured to amplify the first composite signal comprising a quadrature component of the at least one RF signal; and
    the second power amplifier is further configured to amplify the second composite signal comprising an in-phase component of the at least one RF signal and having equal average power as the first composite signal.

11. The multi-mode power amplifier apparatus of claim 10 wherein a selected one of the first signal output and the second signal output is configured to output the at least one RF signal comprising two times the in-phase component.

12. The multi-mode power amplifier apparatus of claim 10 wherein a selected one of the first signal output and the second signal output is configured to output the at least one RF signal comprising two times the quadrature component.

13. The multi-mode power amplifier apparatus of claim 1 wherein, when the at least one RF signal has the modulation bandwidth higher than a bandwidth threshold, the control circuit is further configured to:
    cause a selected one of the first signal output and the second signal output to output the at least one RF signal; and
    cause an open impedance to be coupled to another one of the first signal output and the second signal output not outputting the at least one RF signal.

14. The multi-mode power amplifier apparatus of claim 13 wherein the control circuit is further configured to selectively deactivate one of the first power amplifier and the second power amplifier when an average power of the at least one RF signal is below an average power threshold.

15. The multi-mode power amplifier apparatus of claim 14 wherein the control circuit is further configured to activate both the first power amplifier and the second power amplifier when the average power of the at least one RF signal is above the average power threshold.

16. The multi-mode power amplifier apparatus of claim 13 wherein the control circuit is further configured to couple the selected one of the first signal output and the second signal output to one or more antennas.

17. The multi-mode power amplifier apparatus of claim 1 wherein, when the at least one RF signal has the modulation bandwidth lower than a bandwidth threshold, the control circuit is further configured to:
    cause a selected one of the first signal output and the second signal output to output the at least one RF signal; and
    cause a fixed impedance to be coupled to another one of the first signal output and the second signal output not outputting the at least one RF signal.

18. The multi-mode power amplifier apparatus of claim 17 wherein the control circuit is further configured to couple the selected one of the first signal output and the second signal output to one or more antennas.

19. The multi-mode power amplifier apparatus of claim 1 wherein:
    the at least one RF signal comprises a first RF signal and a second RF signal;
    the first composite signal and the second composite signal each comprises the first RF signal and the second RF signal;
    the output circuit is further configured to regenerate the first RF signal and the second RF signal from the first composite signal and the second composite signal; and
    the control circuit is further configured to cause the first signal output and the second signal output to output the first RF signal and the second RF signal to one or more antennas.

20. The multi-mode power amplifier apparatus of claim 19 wherein:
    the first power amplifier is further configured to amplify the first composite signal comprising a quadrature component of the first RF signal and an in-phase component of the second RF signal; and the second power amplifier is further configured to amplify the second composite signal comprising an in-phase component of the first RF signal and a quadrature component of the second RF signal.

* * * * *